US011793001B2

(12) United States Patent
Evarts et al.

(10) Patent No.: US 11,793,001 B2
(45) Date of Patent: Oct. 17, 2023

(54) SPIN-ORBIT-TORQUE MAGNETORESISTIVE RANDOM-ACCESS MEMORY

(71) Applicant: International Business Machines Corporation, Armonk, NY (US)

(72) Inventors: Eric Raymond Evarts, Niskayuna, NY (US); Virat Vasav Mehta, Menands, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 17/401,415

(22) Filed: Aug. 13, 2021

(65) Prior Publication Data

US 2023/0046923 A1    Feb. 16, 2023

(51) Int. Cl.
*H10B 61/00* (2023.01)
*G11C 11/16* (2006.01)
*H10N 52/00* (2023.01)
*H10N 52/01* (2023.01)
*H10N 52/80* (2023.01)

(52) U.S. Cl.
CPC ............ *H10B 61/20* (2023.02); *G11C 11/161* (2013.01); *H10N 52/00* (2023.02); *H10N 52/01* (2023.02); *H10N 52/80* (2023.02); *G11C 11/1673* (2013.01); *G11C 11/1675* (2013.01)

(58) Field of Classification Search
CPC ... H10B 61/20; G11C 11/161; G11C 11/1673; G11C 11/1675; H10N 52/01; H10N 52/00; H10N 52/80

USPC .......................................................... 257/421
See application file for complete search history.

(56) References Cited

U.S. PATENT DOCUMENTS

| 6,750,540 | B2 | 6/2004 | Kim |
| 9,830,968 | B2 | 11/2017 | Shimomura |
| 10,193,061 | B2 | 1/2019 | Shiokawa |

(Continued)

FOREIGN PATENT DOCUMENTS

| CN | 109643567 A | 4/2019 |
| CN | 110660435 A | 1/2020 |

(Continued)

OTHER PUBLICATIONS

International Search Report and Written Opinion dated Oct. 26, 2022 from International Application No. PCT/IB2022/056619 dated Jul. 19, 2022.

(Continued)

*Primary Examiner* — Jami Valentine Miller
(74) *Attorney, Agent, or Firm* — David K. Mattheis

(57) ABSTRACT

A spin-orbit torque magnetoresistive random-access memory device formed by fabricating a spin-Hall-effect (SHE) layer above and in electrical contact with a transistor, forming a spin-orbit-torque (SOT) magnetoresistive random access memory (MRAM) cell stack disposed above and in electrical contact with the SHE rail, wherein the SOT-MRAM cell stack comprises a free layer, a tunnel junction layer, a reference layer, and a diode structure, forming a write line disposed in electrical contact with the SHE rail, forming a protective dielectric layer covering a portion of the SOT-MRAM cell stack, and forming a read line disposed above and adjacent to the diode structure.

20 Claims, 14 Drawing Sheets

(56) References Cited

U.S. PATENT DOCUMENTS

| | | |
|---|---|---|
| 10,205,088 B2 | 2/2019 | Sasaki |
| 10,319,901 B2 | 6/2019 | Sasaki |
| 10,374,151 B2 | 8/2019 | Komura |
| 10,381,060 B2 | 8/2019 | Kan |
| 10,396,276 B2 | 8/2019 | Sasaki |
| 10,418,545 B2 | 9/2019 | Sasaki |
| 10,438,641 B2 | 10/2019 | Sasaki |
| 10,439,130 B2 | 10/2019 | Sasaki |
| 10,454,023 B2 | 10/2019 | Tang |
| 10,490,249 B2 | 11/2019 | Sasaki |
| 10,490,601 B2 | 11/2019 | Braganca |
| 10,529,914 B2 | 1/2020 | Kakinuma |
| 10,580,470 B2 | 3/2020 | Shiokawa |
| 10,593,388 B2 | 3/2020 | Shiokawa |
| 10,593,868 B2 | 3/2020 | Shiokawa |
| 10,622,048 B2 | 4/2020 | Shiokawa |
| 10,644,228 B2 | 5/2020 | Sasaki |
| 10,651,366 B2 | 5/2020 | Shiokawa |
| 10,665,375 B2 | 5/2020 | Ota |
| 10,741,318 B2 | 8/2020 | Ishitani |
| 10,748,563 B2 | 8/2020 | Sasaki |
| 10,756,262 B2 | 8/2020 | Komura |
| 10,762,941 B2 | 9/2020 | Shiokawa |
| 10,763,430 B2 | 9/2020 | Shiokawa |
| 10,770,214 B2 | 9/2020 | Shiokawa |
| 10,797,231 B2 | 10/2020 | Sasaki |
| 10,840,002 B2 | 11/2020 | Sasaki |
| 10,854,258 B2 | 12/2020 | Shiokawa |
| 10,861,523 B2 | 12/2020 | Sasaki |
| 10,892,400 B2 | 1/2021 | Noh |
| 10,902,987 B2 | 1/2021 | Sasaki |
| 10,910,554 B2 | 2/2021 | Sasaki |
| 10,943,631 B2 | 3/2021 | Sasaki |
| 10,944,045 B2 | 3/2021 | Sasaki |
| 10,971,229 B2 | 4/2021 | Jaiswal |
| 10,971,293 B2 | 4/2021 | Sasaki |
| 10,998,493 B2 | 5/2021 | Komura |
| 11,004,479 B2 | 5/2021 | Bhargava |
| 11,004,490 B2 | 5/2021 | Sakhare |
| 2015/0263069 A1 | 9/2015 | Jo |
| 2017/0092842 A1 | 3/2017 | Khalili Amiri |
| 2017/0117027 A1 | 4/2017 | Braganca |
| 2020/0098822 A1 | 3/2020 | Toh |
| 2020/0235289 A1 | 7/2020 | Alam |
| 2020/0350364 A1* | 11/2020 | Wan ................ G11C 11/161 |
| 2021/0020695 A1 | 1/2021 | Bak |
| 2021/0257543 A1* | 8/2021 | Wu .................. H10N 52/80 |
| 2022/0199685 A1* | 6/2022 | Wan .................. H10B 61/10 |
| 2022/0199686 A1* | 6/2022 | Wan .................. H10B 61/10 |
| 2022/0223649 A1* | 7/2022 | Wan .................. H10B 61/10 |
| 2022/0223650 A1* | 7/2022 | Katine ............... H10B 61/10 |
| 2023/0049812 A1* | 2/2023 | Worledge .......... H10B 61/22 |
| 2023/0050152 A1* | 2/2023 | Hashemi ........... H10B 61/20 |
| 2023/0089984 A1* | 3/2023 | Wu .................... H10B 61/00 |
| | | 257/421 |

FOREIGN PATENT DOCUMENTS

| | | |
|---|---|---|
| CN | 111740011 A | 10/2020 |
| CN | 112420096 A | 2/2021 |
| WO | 20200131893 W | 6/2020 |
| WO | 2020192201 A1 | 10/2020 |

OTHER PUBLICATIONS

IBM Appendix P, "List of patent and patent applications treated as related", Filed Aug. 13, 2021, 2 pages.

Kim et al., "Multilevel Spin-Orbit Torque MRAMs," in IEEE Transactions on Electron Devices, vol. 62, No. 2, pp. 561-568, Feb. 2015, doi: 10.1109/TED.2014.2377721.

Seo et al., "Area-Efficient SOT-MRAM With a Schottky Diode", IEEE Electron Device Letters, vol. 37, No. 8, Aug. 2016, 4 pps.

U.S. Appl. No. 17/401,383, filed Aug. 13, 2021.

U.S. Appl. No. 17/401,394, filed Aug. 13, 2021.

* cited by examiner

SPIN-ORBIT-TORQUE MAGNETORESISTIVE RANDOM-ACCESS MEMORY

BACKGROUND

The disclosure relates generally to magnetoresistive random-access memory (MRAM). The disclosure relates particularly to spin-orbit torque MRAM structures controlled by a single transistor.

MRAM is a type of solid state, non-volatile memory that uses tunneling magnetoresistance (TMR) to store information. MRAM is made up of an electrically connected array of magnetoresistive memory elements, referred to as magnetic tunnel junctions (MTJs). Each MTJ includes a free layer and fixed layer that each include a layer of a magnetic material, and that are separated by a non-magnetic insulating tunnel barrier. The free layer has a variable magnetization direction, and the fixed layer has an invariable magnetization direction. An MTJ stores information by switching the magnetization state of the free layer. When the magnetization direction of the free layer is parallel to the magnetization direction of the fixed layer, the MTJ is in a low resistance state. Conversely, when the magnetization direction of the free layer is antiparallel to the magnetization direction of the fixed layer, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM. MRAM cells can be formed as a vertical stack enabling device design options for increasing device memory cell element density while maintaining or even reducing the scale of devices.

Spin-orbit-torque (SOT) MRAM cells include a spin-orbit torque, or spin-Hall-effect (SHE), layer in contact with the magnetic tunnel junction (MTJ) structure of the MRAM. The SHE is typically a heavy conductive metal, such as platinum or tantalum. Current is passed through the SHE layer, but not through the MTJ structure, to write to the cell and current is passed through the MTJ to read the cell. Since high voltage write energies are not passed though the MTJ of the MRAM cell, SOT MRAM tend to be more reliable and have a longer lifecycle. Less energy is used in writing the SOT MRAM, as the write energy does not pass through the MTJ. Passing the write current through the SHE layer, and not through the MTJ structure, also yields fewer writing errors, and higher writing speeds—further reducing the energy needed per write operation.

Control of read and write functions for a standard SOT-MRAM cell includes a first transistor controlling the read current through the cell and a second transistor controlling the write current through the SHE line of the cell. The relevant circuit die area for such SOT-MRAM cells therefore includes the cell and the two control transistors.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a spin-orbit torque magnetoresistive random-access memory device formed by fabricating a spin-Hall-effect (SHE) layer above and in electrical contact with a transistor, forming a spin-orbit-torque (SOT) magnetoresistive random access memory (MRAM) cell stack disposed above and in electrical contact with the SHE rail, wherein the SOT-MRAM cell stack comprises a free layer, a tunnel junction layer, a reference layer, and a diode structure, forming a write line disposed in electrical contact with the SHE rail, forming a protective dielectric layer covering a portion of the SOT-MRAM cell stack, and forming a read line disposed above and adjacent to the diode structure.

In one aspect, a spin-orbit torque magnetoresistive random-access memory device including a spin-Hall-effect (SHE) rail, a spin-orbit-torque (SOT) magnetoresistive random access memory (MRAM) cell stack disposed above and in electrical contact with the SHE rail, wherein the SOT-MRAM cell stack comprises a free layer, a tunnel junction layer, a reference layer, and a diode structure, a write line disposed in electrical contact with the SHE rail, and a read line disposed above and adjacent to the diode structure.

In one aspect, a spin-orbit torque magnetoresistive random-access memory device including a spin-Hall-effect (SHE) rail disposed in contact with a transistor, a spin-orbit-torque (SOT) magnetoresistive random access memory (MRAM) cell stack disposed above and in electrical contact with the SHE rail, wherein the SOT-MRAM cell stack comprises a free layer, a tunnel junction layer, a reference layer, and a diode structure, a write line disposed in electrical contact with the SHE rail, and a read line disposed above and adjacent to the diode structure.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
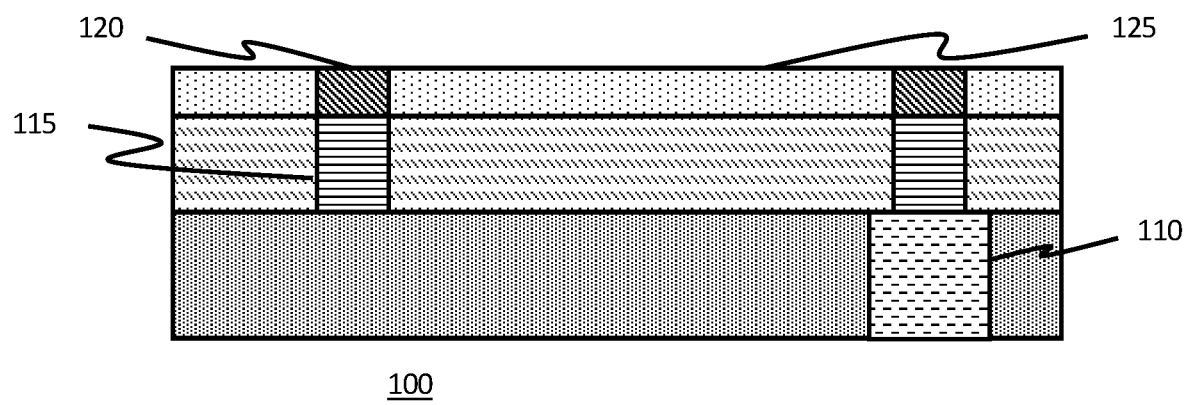
FIG. 1 provides a cross-sectional view of a step in the fabrication of a semiconductor device, according to an embodiment of the invention. The figure illustrates bottom electrodes fabricated above M1 rails. One bottom electrode is fabricated in contact with a transistor.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein can be interpreted accordingly. In addition, it should be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Spin-transfer torque (STT) magnetoresistive random-access memory (MRAM) passes current through the magnetic tunnel junction of the memory cell during each of the read and write operations. High write energies can reduce the longevity of the devices by degrading the device materials. Spin-orbit torque (SOT) MRAM devices resolve this issue by only passing relatively low read operation energies directly through the magnetic tunnel junction of the MRAM cell. The SOT, or spin Hall-effect (SHE) plate of the SOT MRAM cell must have a cross sectional area equal to or greater than the rest of the MRAM cell stack to effectively alter the free layer and write to the cell. Writing to a SOT MRAM cell does not require passing energy through the SOT MRAM cell stack. Typical SOT-MRAM cells structures include two transistors, one associated with writing a value to the cell and one associated with reading the value of the cell. Structures including two transistors require additional die area for each cell. Disclosed embodiments incorporate a diode within the SOT-MRAM cell stack and enable the control of both read and write operations for the cell through a single transistor. The use of a single transistor for each cell enables higher cell densities and supports additional integration of the device elements.

In an embodiment, a vertical SOT MRAM cell stack is etched from material layers deposited upon an underlying semiconductor device. As shown in FIG. 1, device 100 includes a front-end-of-line transistor contact 110, common metal lines 115, shared across rows of SOT-MRAM cells, and bottom electrodes 120 disposed upon the common metal lines 115. Bottom electrodes 120 may include TaN or TiN deposited by CVD, PVD or similar methods. In an embodiment, bottom electrodes 120 are formed by masking and selective etching a layer of electrode material between about 1 nm and about 10 nm in thickness. After etching bottom electrodes 120, a dielectric layer 125 is disposed around and above the bottom electrodes 120 and then recessed to the upper surface of the bottom electrodes 120 using chemical-mechanical planarization (CMP) processes to provide a polished flat surface for the next step.

Figure 2:
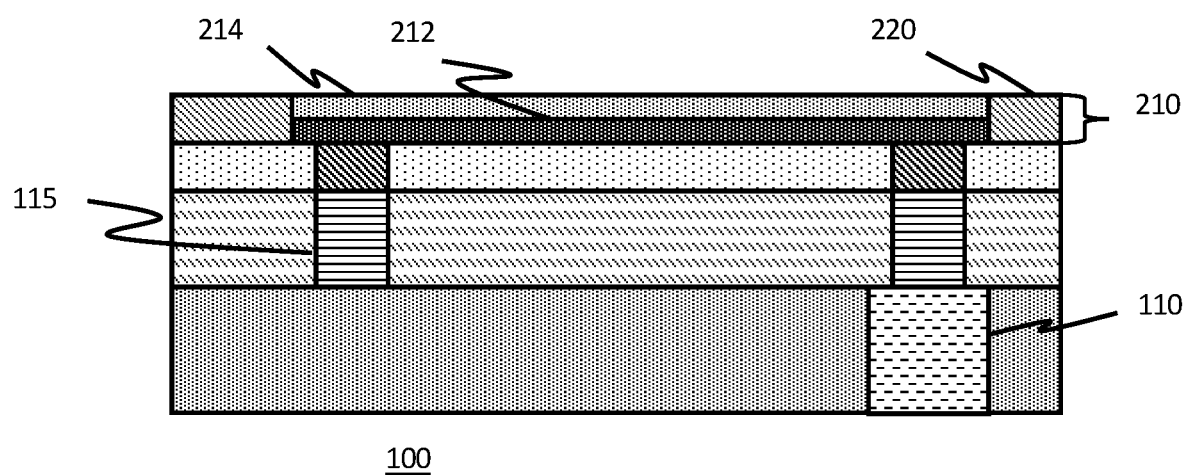
FIG. 2 provides a cross-sectional view of a step in the fabrication of a semiconductor device, according to an embodiment of the invention. The figure illustrates the device after formation of the SHE rail.

As shown in FIG. 2, SHE layer 210 is disposed upon bottom electrodes 120 and dielectric material 125. In an embodiment, SHE layer 210 consists of one or more heavy, conductive metals such as platinum, palladium, tungsten, cobalt, tantalum, or similar conductive metals. In an embodiment, the SHE layer 210 has a thickness of between about 10 nm and about 50 nm. In an embodiment, SHE layer 210 consists of Bi2Se3. In an embodiment, SHE layer 210 consists of multiple layers of heavy metals such as Ta and Pt, deposited in succession. FIG. 2 illustrates the fabrication of SHE rail 210 to include a lower layer 212 of Ta and an upper layer 214 of Pt. Deposition of the SHE layer 210 occurs by deposition processes including, e.g., chemical vapor deposition (CVD), physical vapor deposition (PVD), atomic layer deposition (ALD), or similar processes. After deposition of the SHE metal layers 210, the layers are masked and selectively etched forming the final SHE rails above and in electrical contact with the bottom electrodes 120. A protective dielectric material 220, is disposed around and above the SHE rails 210. The dielectric material is then recessed to the upper surface of the SHE rails 210 using CMP processes yielding a polished surface for the next step.

Figure 3:
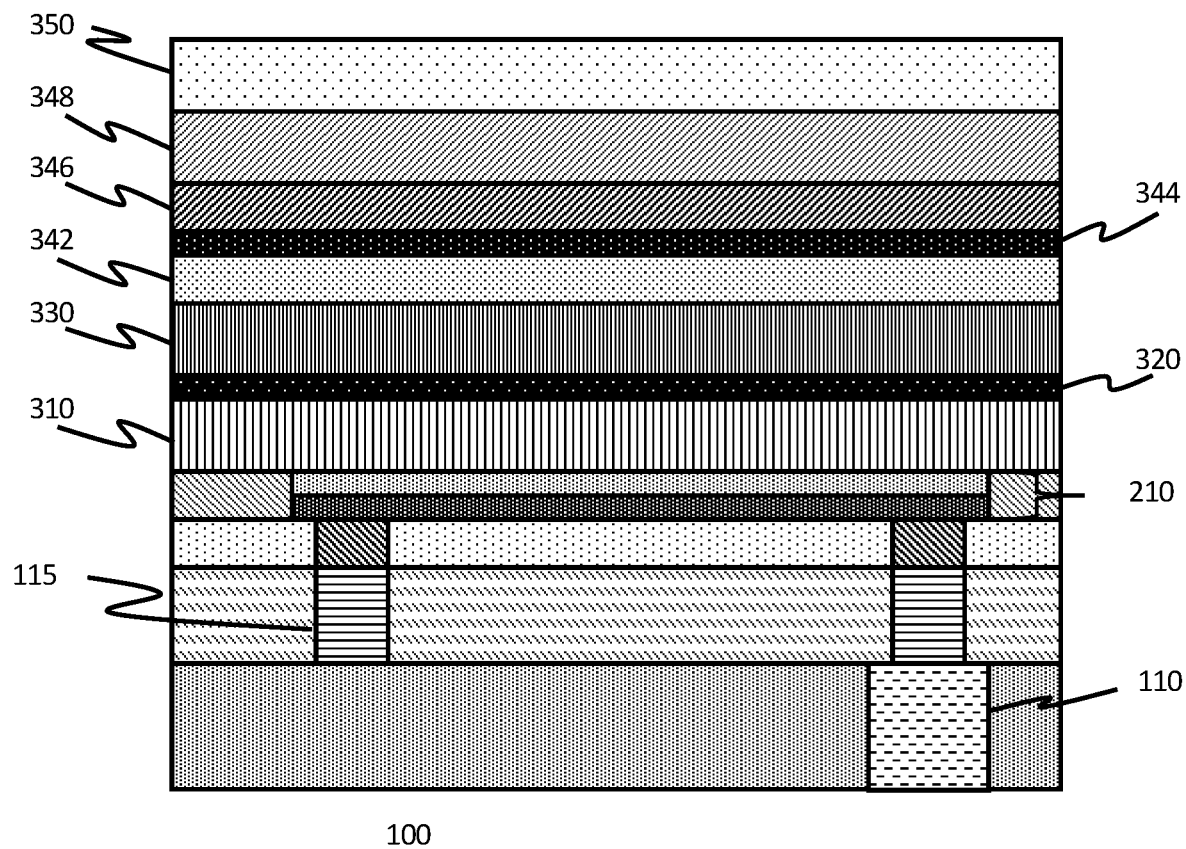
FIG. 3 provides a cross-sectional view of a step in the fabrication of a semiconductor device, according to an embodiment of the invention. The figure illustrates the device after the addition of MRAM cell layers and an upper protective hard mask.

FIG. 3 illustrates the device after the deposition of a succession of material layers. The succession of layers form the SOT-MRAM cells including a diode in each cell. As shown in FIG. 3, the layers for the MTJ stacks include a simplistically depicted MTJ made of a free magnetic layer 310 (a layer having a switchable magnetic dipole moment), a tunnel barrier layer 320, a reference magnetic layer 330 (a layer having a fixed magnetic dipole moment), Diode layers 342, 344, 346, and 348, and hard mask layer 350.

In this embodiment, the MTJ includes a seed layer (not shown) having free layer 310 grown thereon. The seed layer may include, for example, tantalum (Ta) or tantalum magnesium (TaMg) in some embodiments. The free layer 310 may include cobalt-iron-boron (CoFeB), for example. The respective layers may be formed by PVD. Next, a tunnel barrier layer 320 is formed on free layer 310. The tunnel barrier layer 320 may include a non-magnetic insulating material such as magnesium oxide (MgO). In an embodiment, tunnel barrier layer 320 is between about 1 nm and about 3 nm in thickness. Following the formation of the tunnel barrier layer 320, the reference layer 330 is formed on top of the tunnel barrier layer 320. The reference layer 330 may include, for example one or more interfacial layers, or spacers, and ruthenium, cobalt, palladium, tantalum, iron, boron, cobalt-platinum (ColPt) or cobalt-palladium (ColPd), in multilayers or a mixture. In an embodiment, reference layer 330 is between about 3 nm and about 10 nm in thickness. The respective layers may be formed by PVD. The free layer 310 and the reference layer 330 have perpendicular magnetic anisotropy.

In an embodiment, the diode stack layers include a first metal layer 342, such as Ta, in contact with the reference layer 330 of the MTJ. A second metal layer 344, such as Ti, is disposed above first metal layer 342. A metal-oxide layer 346, such as $TiO_2$, is disposed above the second metal layer 344. An upper metal layer 348 is disposed above metal-oxide layer 346. In an embodiment, each metal layer comprises a thickness of between about 5 nm and about 50 nm. In an embodiment, the metal-oxide layer comprises a thickness of between about 2 nm and about 10 nm.

In an embodiment, the hard mask layer 350 consists of TaN or TiN deposited by CVD or PVD to a thickness of between about 20 nm and about 60 nm. In an embodiment, hard mask layer 350 consists of a nitride, oxide, an oxide-nitride bilayer, or another suitable material. In some embodiments, the hard mask layer 350 may include an oxide such as silicon oxide (SiO), a nitride such as silicon nitride (SiN), an oxynitride such as silicon oxynitride (SiON), combinations thereof, etc. In some embodiments, the hard mask layer 350 is a silicon nitride such as $Si_3N_4$.

Figure 4:
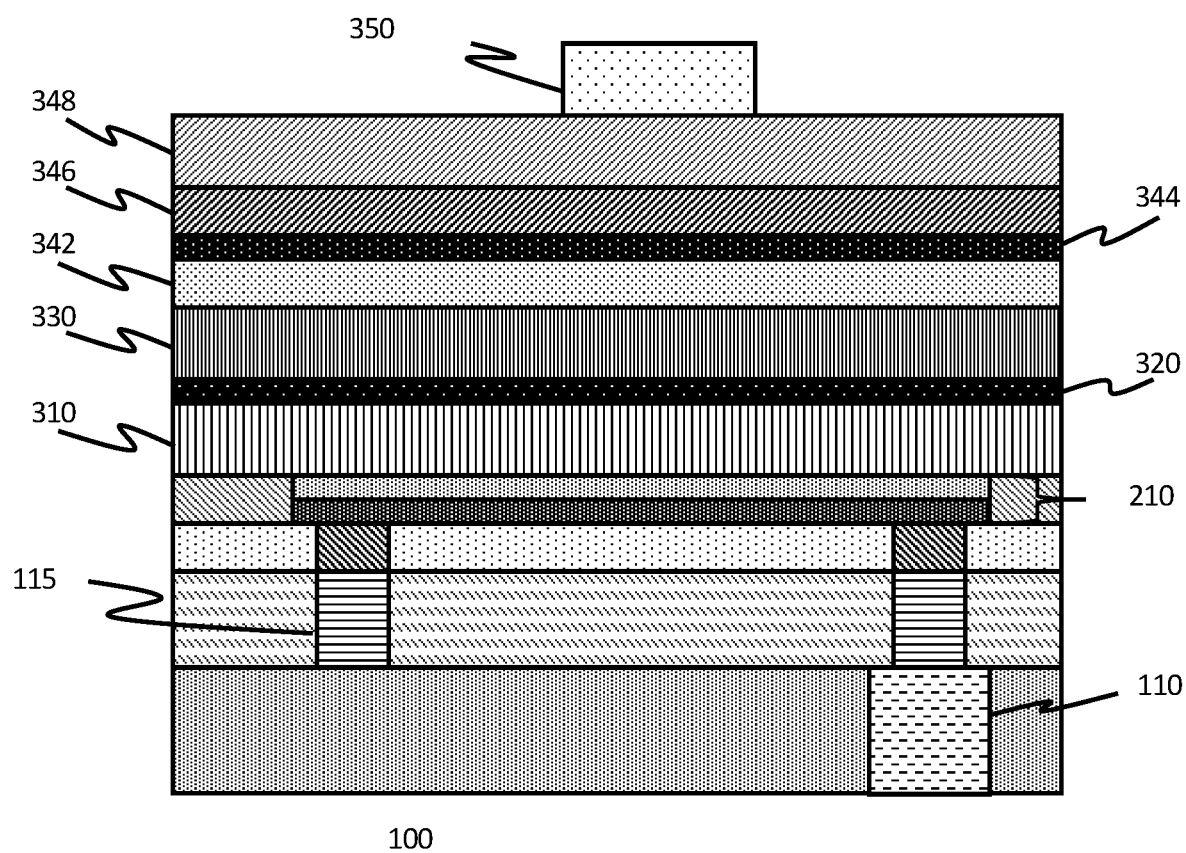
FIG. 4 provides a cross-sectional view of a step in the fabrication of a semiconductor device, according to an embodiment of the invention. The figure illustrates the device after the patterned etching of the upper hard mask.

As shown in FIG. 4, after patterning and etching, the width, or horizontal dimension (in direction X-X'), of the hard mask layer 350 matches that of the desired underlying SOT-MRAM cell stack. In an embodiment, hard mask layer 350 is anisotropically etched using IBE or reactive ion etching (RIE) or similar methods. The remainder of hard mask layer 350 is then selectively removed leaving the protrusion extending from the SOT-MRAM cell stack layers.

Figure 5:
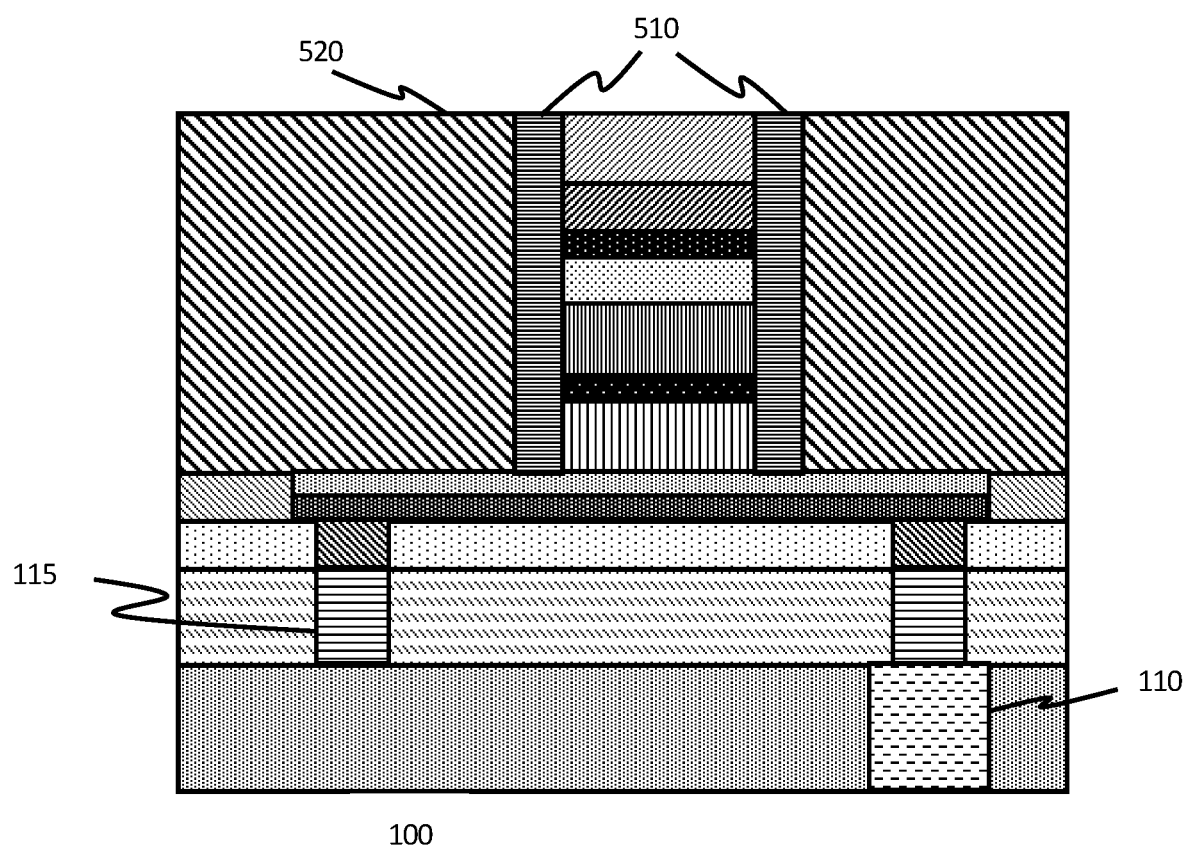
FIG. 5 provides a cross-sectional view of a step in the fabrication of a semiconductor device, according to an embodiment of the invention. The figure illustrates the device after the selective etching of the MRAM cell stack, the formation of protective sidewalls and the deposition of ILD material.

In an embodiment, the lower SOT MRAM cell stacks are formed using a patterning and etching process such as RIE. As shown in FIG. 5, layers 310-350 have been selectively etched away using ion-beam etching, leaving the SOT MRAM cell stack in contact with bottom electrode 120 and in electrical contact with a contact 110 of a device element (e.g., a transistor) of the underlying semiconductor device, a free layer 310, a tunnel barrier layer 320, a reference layer 330, diode stack 340, and hard mask 350. As shown in the figure, dielectric spacer material 510 and interlayer dielectric material 520 have been deposited upon the lower SOT MRAM cell stack.

In an embodiment, dielectric space material 510, such as SiN, is deposited upon the intermediate structure of the device, including the SOT-MRAM cell stacks. After deposition of the material 510, anisotropic etching, or other methods are used to remove the material from the horizontal surfaces of the device, leaving protective sidewalls of the material upon the vertical surfaces of the SOT-MRAM cell stacks. Subsequent to the formation of the protective sidewalls, an ILD material 520 is deposited upon the device and CMP processes are used to recess the ILD material 520, and hard mask 410, to the upper surface of the upper metal layer 348, of diode stack 340. The CP processes yield a polished upper device surface in preparation for the next step.

Figure 6:
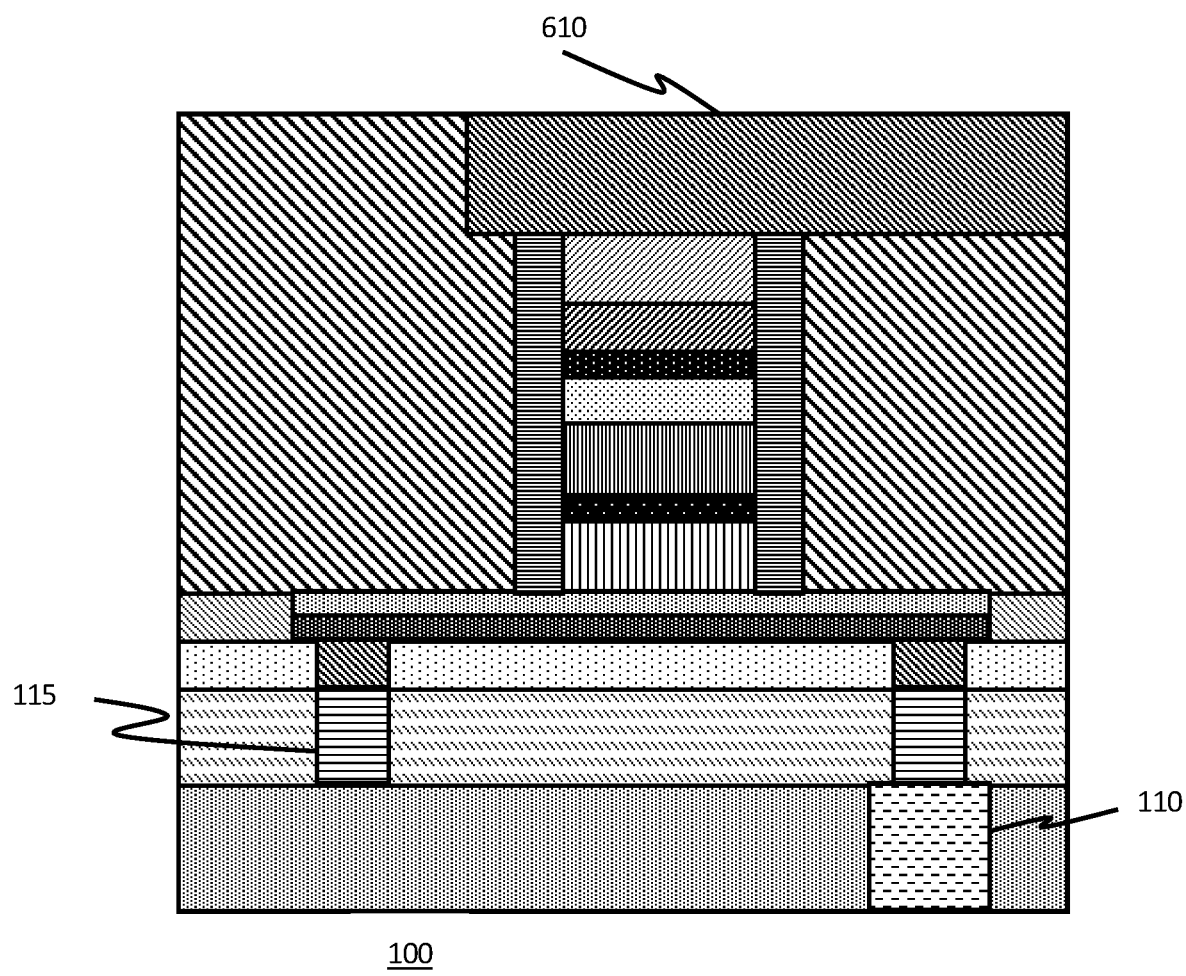
FIG. 6 provides a cross-sectional view of a step in the fabrication of a semiconductor device, according to an embodiment of the invention. The figure illustrates the device after deposition of an upper M2 electrode in contact with the MRAM cell stack.

As shown in FIG. 6, upper device electrode 610 has been formed in contact with the SOT-MRAM cell stack. In an embodiment, a layer of electrode material is deposited above the intermediate structure of FIG. 5. This layer is masked and selectively etched resulting in upper electrode 610. After forming electrode 610, additional ILD material is deposited upon the structure and recessed using CMP process to the upper surface of electrode 610 to provide a polished surface for subsequent back-end-of-line steps.

Figure 7:
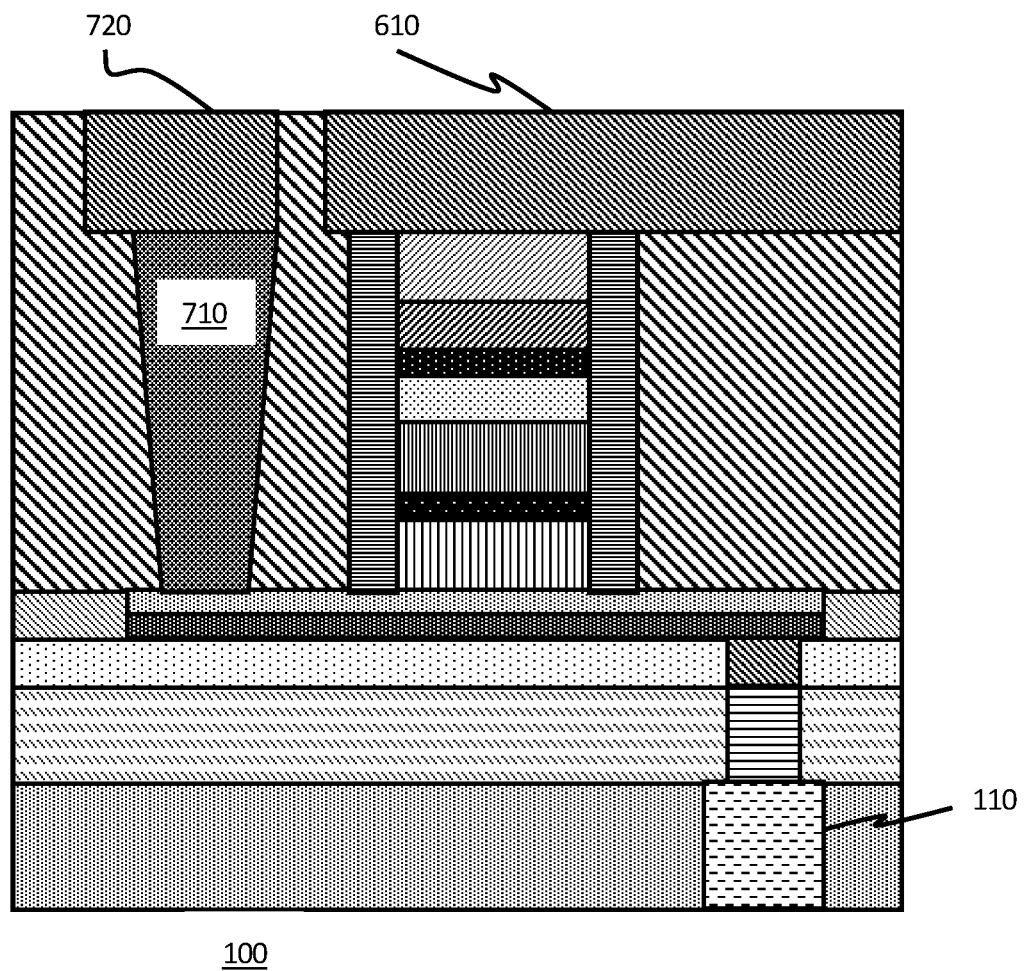
FIG. 7 provides a cross-sectional view of a step in the fabrication of a semiconductor device, according to an embodiment of the invention. The figure illustrates a second embodiment of the device wherein the write electrode is disposed above the SHE rail.

FIGS. 1-6 illustrate a device wherein the write electrode is disposed beneath the SHE rail of the cell. FIG. 7 illustrates a configuration of the device wherein the write electrode is disposed above the SHE rail of the cell. As shown in the Figure, a via is etched through ILD material 520, exposing SHE rail 210. A metal material 710 is disposed in the via, and upper write electrode 720 is fabricated as part of patterning and etching the metal layer to form upper electrode 610. After formation of the upper electrodes, ILD material is deposited upon the device and CMP processes recess the ILD material to the upper surfaces of electrodes 610 and 720 to provide a polished surface for further fabrication steps.

Figure 8:
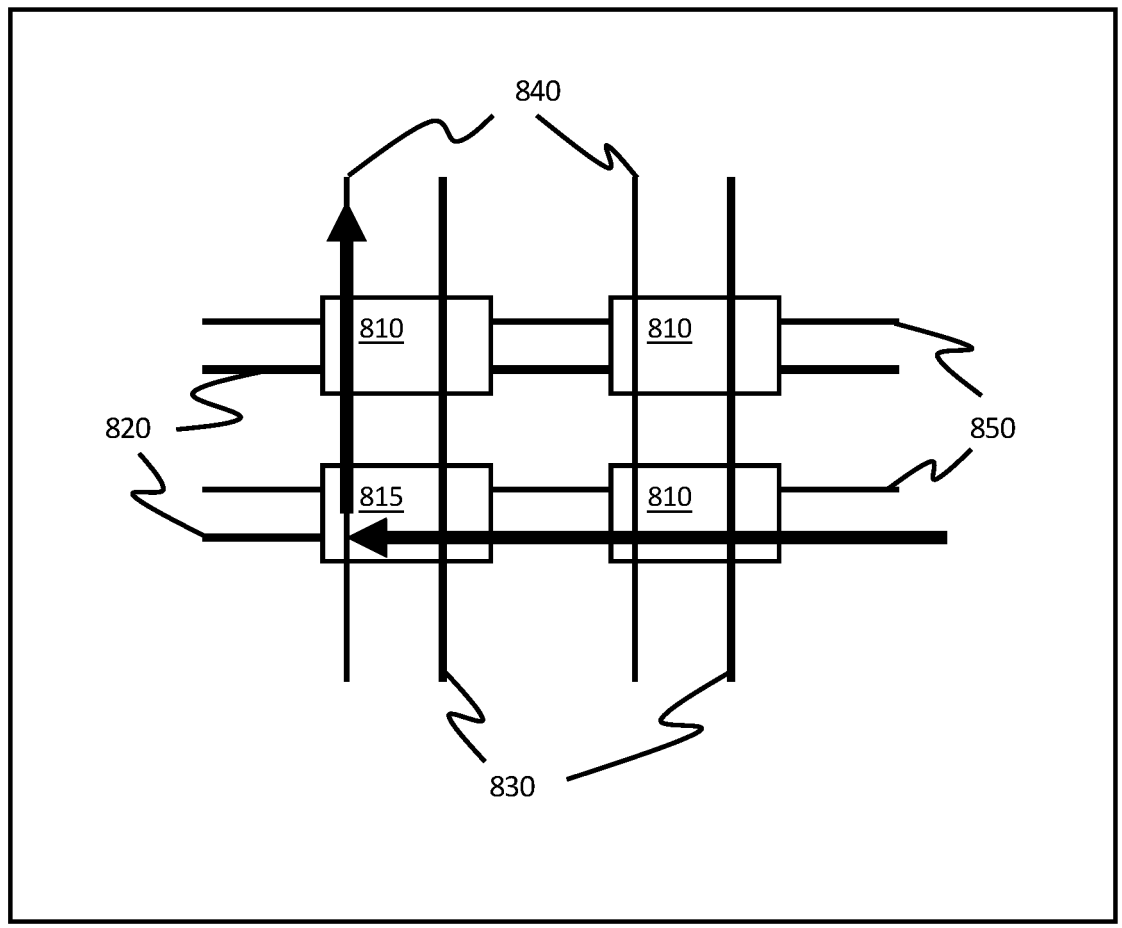
FIG. 8 provides a schematic illustration of current flow during a write operation, for one embodiment of the invention.
Figure 9:
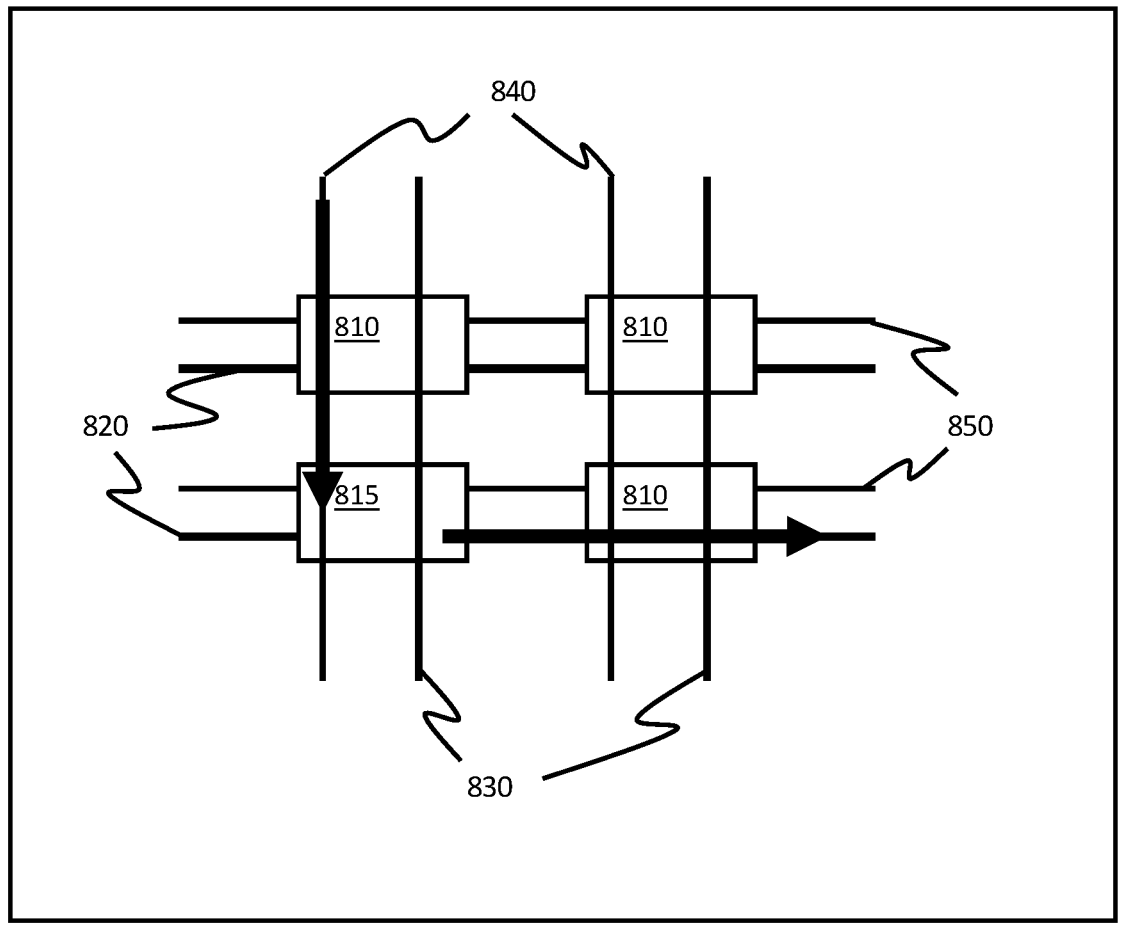
FIG. 9 provides a schematic illustration of current flow during a write operation, for one embodiment of the invention.
Figure 10:
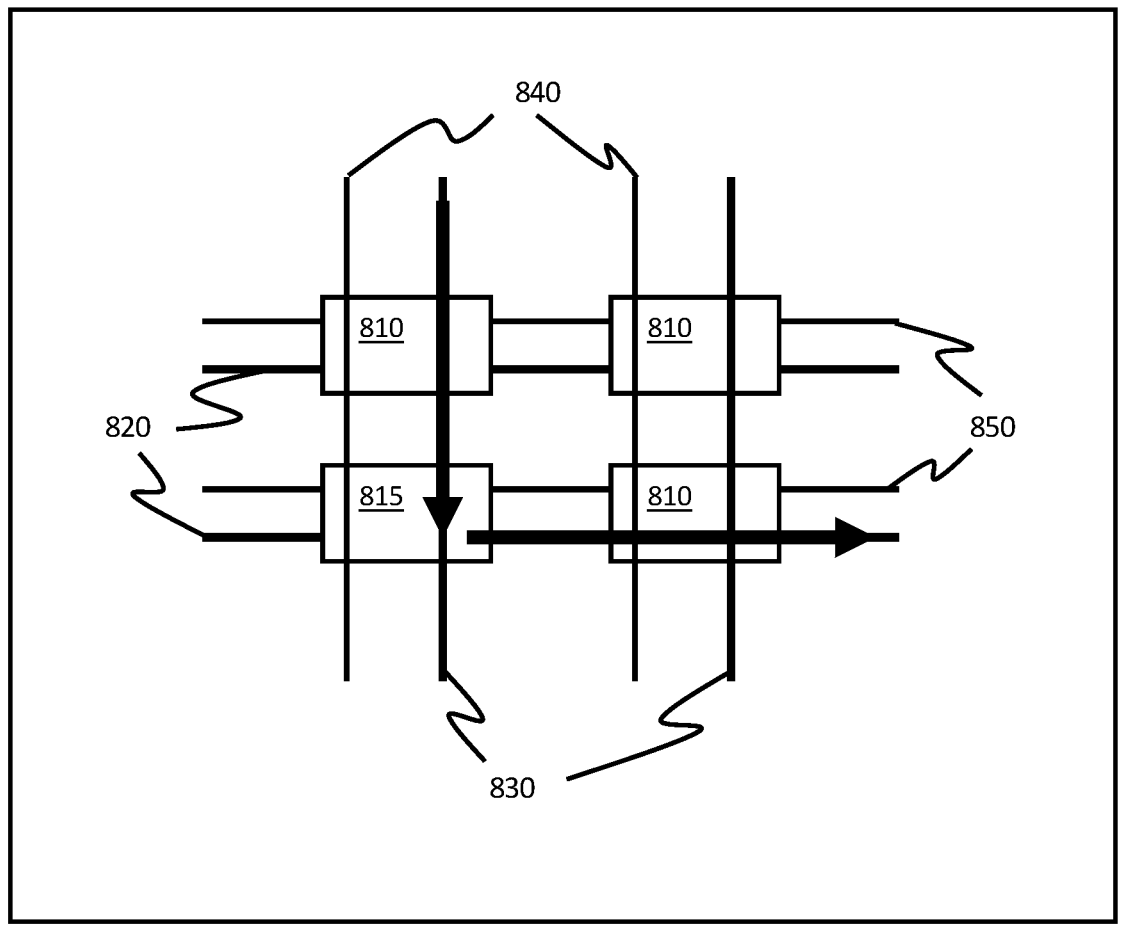
FIG. 10 provides a schematic illustration of current flow during a read operation, for one embodiment of the invention.

FIG. 8-10 provide plan views of multiple SOT-MRAM cells 810, 815, together with word lines 820, read lines 830, write lines 840, and transistor gate lines 850 for the cells. The figures corresponds to structures depicted in FIG. 7.

Reading a SOT-MRAM cell comprises applying a known voltage across the cell stack, between the read electrode and the ground through the transistor and measuring the current through the stack. The resistance of the stack is determined from the voltage and current. The resistance indicates either a cell value of "0", or "1". Each cell has two write commands.

A first write command applies a negative voltage across the SHE rail of the cell, between the transistor and the write electrode, this write command switches the free layer of the SOT-MRAM from a parallel state to a antiparallel state with regard to the reference layer of the stack. The second write command applies a positive voltage across the SHE rail of the cell, between the transistor and the write electrode, this write command switches the free layer of the SOT-MRAM from an antiparallel state to a parallel state with regard to the reference layer of the stack.

Incorporating a diode in the SOT-MRAM cell stack limits the direction of current flow through the stack to the direction from the read electrode, through the stack to the ground through the transistor. This limitation enables control of both write commands and the read command for the cell through a single transistor.

As shown in FIG. 8, current for a negative write pulse for SOT-MRAM cell 815, passes from the ground, through the transistor, the SHE rail and out through the write electrode/write line 840.

As shown in FIG. 9, current for a positive write pulse passes from the write electrode/write line 840 through the SHE rail, the transistor, and out through the ground/word line 820.

As shown in FIG. 10, current for a read pulse passes from the read electrode/read line 830, through the SOT-MRAM cell stack and out through the transistor to the ground/word line 820.

Figure 11:
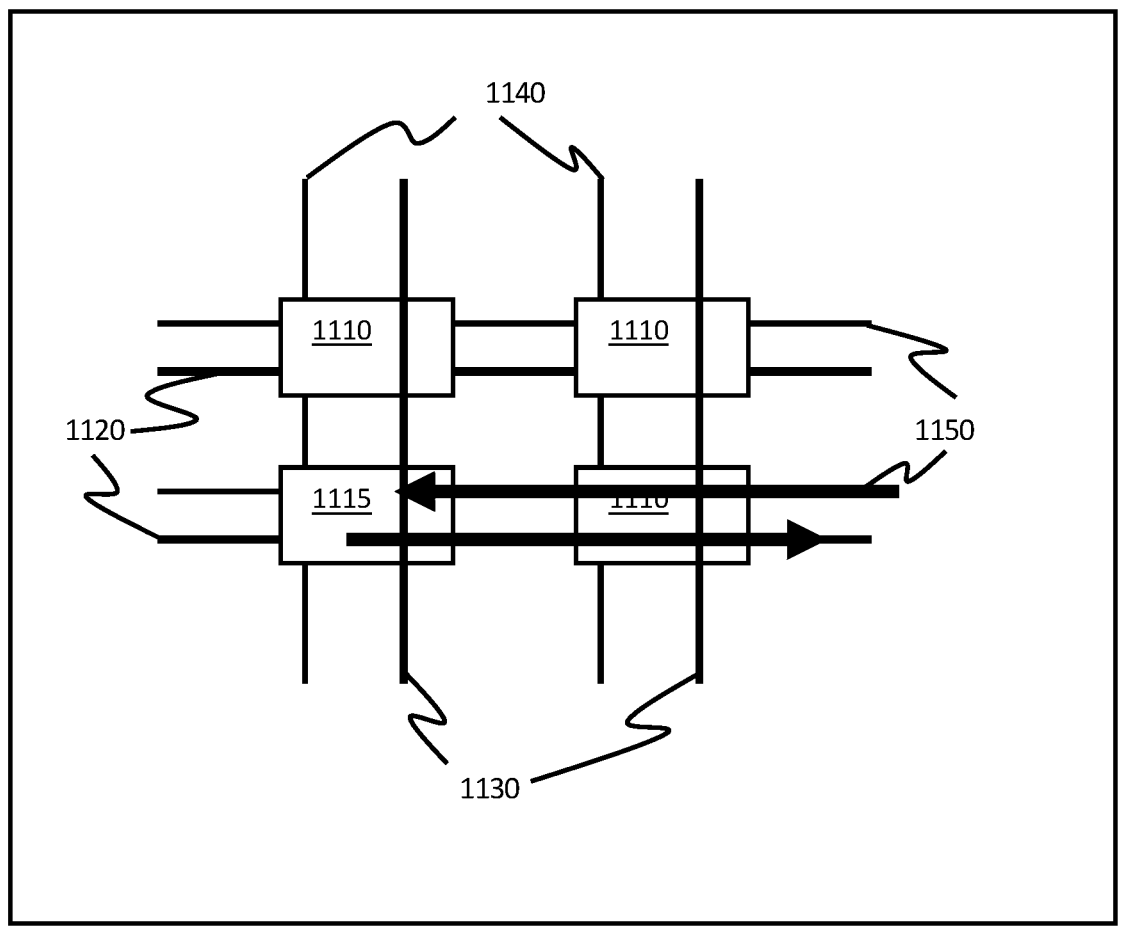
FIG. 11 provides a schematic illustration of current flow during a write operation, for one embodiment of the invention.
Figure 12:
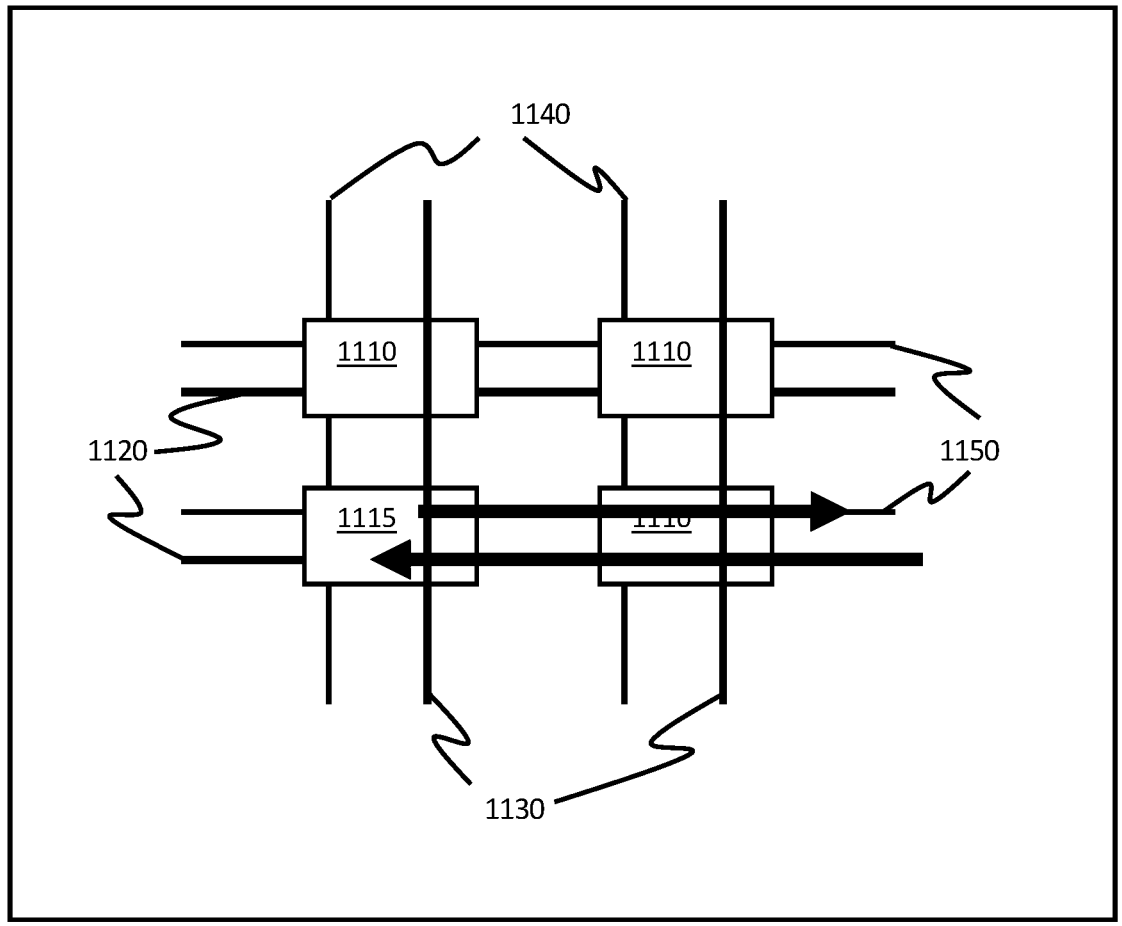
FIG. 12 provides a schematic illustration of current flow during a write operation, for one embodiment of the invention.
Figure 13:
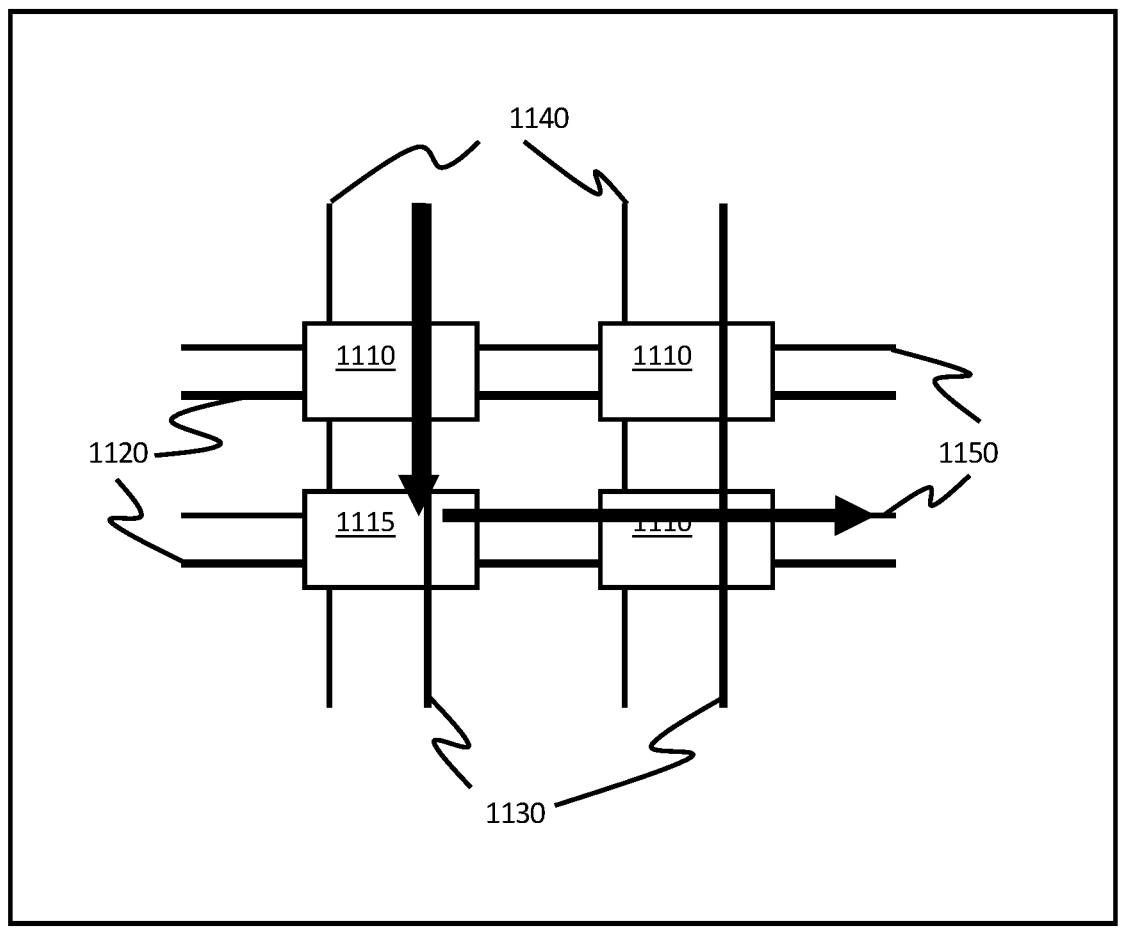
FIG. 13 provides a schematic illustration of current flow during a read operation, for one embodiment of the invention.

FIG. 11-13 provide plan views of multiple SOT-MRAM cells 1110, 1115, together with word (ground) lines 1150, read lines 1130, write lines 1120, and transistor gate lines 1140, for the cells. The figures corresponds to structures depicted in FIG. 6.

As shown in FIG. 11, current for a negative write pulse for SOT-MRAM cell 1115, passes from the ground line 1150, through the transistor, the SHE rail and out through the write electrode/write line 1120.

As shown in FIG. 12, current for a positive write pulse passes from the write line 1120, through the write electrode through the SHE rail, the transistor, and out through the ground/word line 1150.

As shown in FIG. 13, current for a read pulse passes from the read line 1130, through the read electrode, through the SOT-MRAM cell stack and out through the transistor to the ground 1150.

Figure 14:
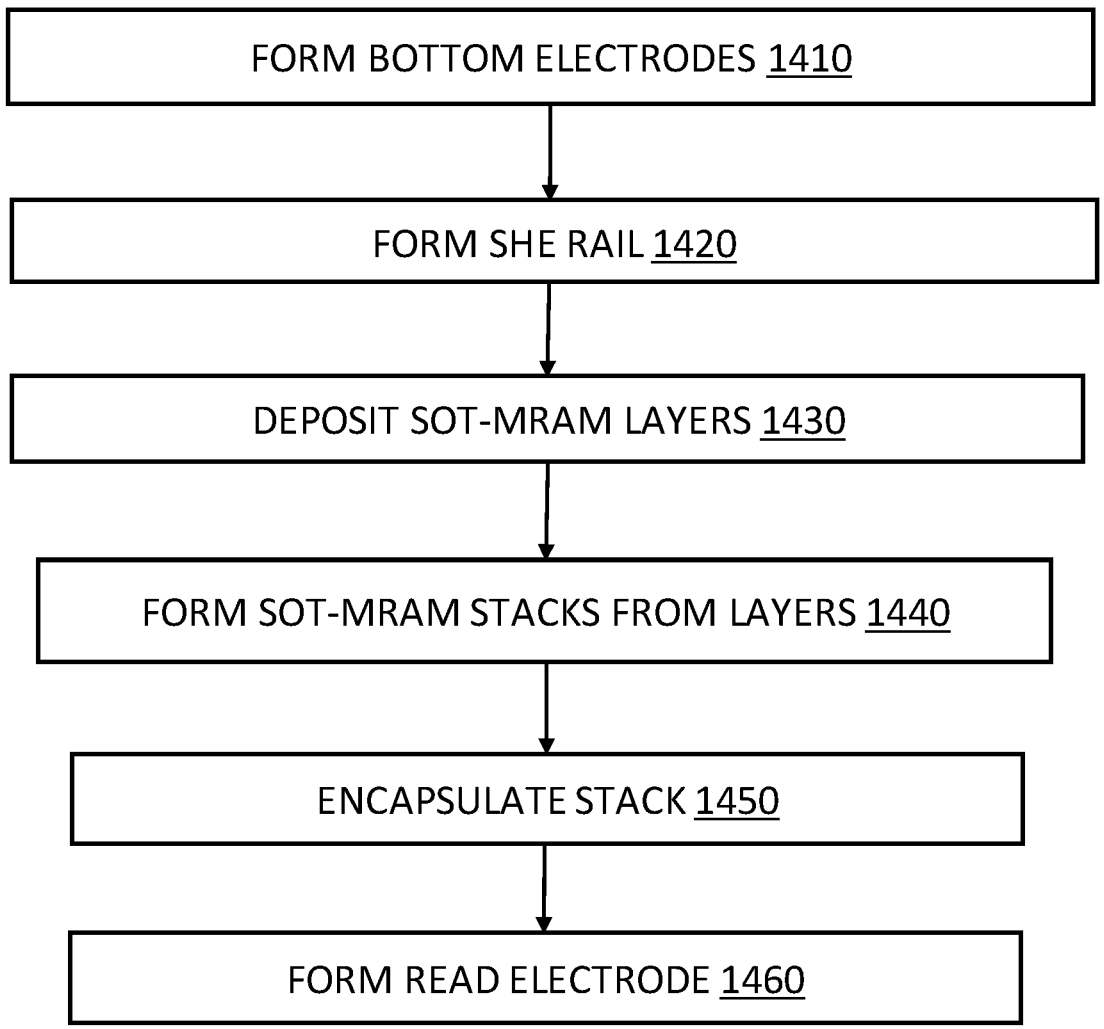
FIG. 14 provides a flowchart depicting operational steps for forming semiconductor device, according to an embodiment of the invention.

FIG. 14 provides a flowchart 1400 depicting operational steps associated with the fabrication of the disclosed SOT MRAM devices. According to the figure, at block 1410, lower electrodes are formed upon an underlying semiconductor device. The lower electrodes include a conductive metal layer deposited upon the underlying semiconductor device and selectively patterned and etched. The underlying semiconductor device includes transistors ultimately used to control read and write operations of the SOT MRAM cells. The upper surface of the underlying semiconductor device includes exposed metal contacts of the respective device transistors. In an embodiment, a lower electrode not in direct contact with a device transistor forms the write electrode for the SOT-MRAM cell stack.

At block 1420, a spin-orbit-torque (SOT), spin-Hall-effect (SHE rail is formed in contact with the lower electrodes. Patterning and selective etching yield appropriate SHE rails. The rails are then surrounded by protective dielectric material.

At block 1430, the SOT MRAM cell stack is formed. The stack includes a succession of material layers, a free layer in contact with the SHE layer and having a switchable magnetic dipole moment, a tunneling junction layer, a reference layer having a fixed magnetic dipole moment, a diode stack including a metal-oxide/metal diode structure, and a protective hard mask material layer. Each layer is formed across the entire cross section of the device.

At block 1440 the hard mask layer is then patterned and selectively etched to form an array of hard mask portions in the pattern of the desired array of SOT-MRAM cells of the device The remaining SOT-MRAM cell stack layers are then selectively etched back leaving the SOT MRAM stack in contact with the SHE rail. The SHE rail is disposed above and in electrical contact with a metal contact of a transistor of the underlying semiconductor device.

At block 1450 the formed stack is encapsulated by a first dielectric material. The first dielectric material is etched back exposing the upper surface of the upper layer of the diode stack of the SOT MRAM stack. An interlayer dielectric material is deposited over the device and a CMP process smooths the common upper surface of the ILD material, the encapsulating dielectric material and the upper layer material. In an embodiment, the process yields an array of SOT MRAM cell stacks disposed across the surface of the device.

At block 1460 the read electrode for the SOT-MRAM cell is formed from a metallic layer deposited over the SOT-MRAM cells and ILD material. The layer is patterned and selectively etched yielding upper read electrodes in contact with the upper electrode layers of the diode stacks of the array of SOT-MRAM cells.

In an embodiment, upper write electrodes are formed in contact with the SHE rails of the SOT-MRAM cells. In this embodiment, vias are formed through the ILD material described for block 1450. The vias expose portions of the SHE rails of the SOT-MRAM cells. The vias are filled with conductive material and CMP processes yield a common polished surface including the upper surface of the SOT-MRAM cell diode stacks as well as the upper surface of the material in the write electrode via. Upper read and write electrodes for each SOT-MRAM cell are then formed from a common metal layer as described for block 1460.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An MRAM (magnetoresistive random-access memory) structure comprising:
   a spin-Hall-effect (SHE) rail;
   an spin-orbit-torque (SOT) magnetoresistive random access memory (MRAM) cell stack disposed above and in electrical contact with the SHE rail, wherein the SOT-MRAM cell stack comprises a free layer, a tunnel junction layer, a reference layer, and a diode structure;
   a write line disposed in electrical contact with the SHE rail; and
   a read line disposed above and adjacent to the diode structure.

2. The MRAM structure according to claim 1, wherein the SHE rail is disposed in electrical contact with a transistor.

3. The MRAM structure according to claim 1, wherein diode structure comprises a metal-oxide-metal layered structure.

4. The MRAM structure according to claim 1, wherein the free layer is disposed adjacent to the SHE rail.

5. The MRAM structure according to claim 1, wherein the write line is disposed above the SHE rail.

6. The MRAM structure according to claim 1, wherein the write line is disposed below the SHE rail.

7. The MRAM structure according to claim 1, wherein the SHE rail comprises a material selected from the group consisting of Ta, Pt, W, Jr, and combinations thereof.

8. The MRAM structure according to claim 1, wherein the diode structure comprises a $TiO_2/Ti$ layer stack.

9. An MRAM (magnetoresistive random-access memory) structure comprising:
   a spin-Hall-effect (SHE) rail disposed in electrical contact with a transistor;
   an spin-orbit-torque (SOT) magnetoresistive random access memory (MRAM) cell stack disposed above and in electrical contact with the SHE rail, wherein the SOT-MRAM cell stack comprises a free layer, a tunnel junction layer, a reference layer, and a diode structure;
   a write line disposed in electrical contact with the SHE rail; and
   a read line disposed above and adjacent to the diode structure.

10. The MRAM structure according to claim 9, wherein diode structure comprises a metal-oxide-metal layered structure.

11. The MRAM structure according to claim 9, wherein the free layer is disposed adjacent to the SHE rail.

12. The MRAM structure according to claim 9, wherein the write line is disposed above the SHE rail.

13. The MRAM structure according to claim 9, wherein the write line is disposed below the SHE rail.

14. The MRAM structure according to claim 9, wherein the SHE rail comprises a material selected from the group consisting of Ta, Pt, W, Ir, and combinations thereof.

15. The MRAM structure according to claim 9, wherein the diode structure comprises a $TiO_2/Ti$ layer stack.

16. A method of fabricating a semiconductor device, the method comprising:
   forming a spin-Hall-effect (SHE) layer above and in electrical contact with a transistor;
   forming a spin-orbit-torque (SOT) magnetoresistive random access memory (MRAM) cell stack disposed above and in electrical contact with the SHE rail, wherein the SOT-MRAM cell stack comprises a free layer, a tunnel junction layer, a reference layer, and a diode structure;

forming a write line disposed in electrical contact with the SHE rail;

forming a protective dielectric layer covering a portion of the SOT-MRAM cell stack; and forming a read line disposed above and adjacent to the diode structure.

17. The method of fabricating a semiconductor structure according to claim 16, wherein diode structure comprises a metal-oxide-metal layered structure.

18. The method of fabricating a semiconductor structure according to claim 16, wherein the free layer is disposed adjacent to the SHE rail.

19. The method of fabricating a semiconductor structure according to claim 16, wherein the write line is disposed above the SHE rail.

20. The method of fabricating a semiconductor structure according to claim 16, wherein the write line is disposed below the SHE rail.

* * * * *